United States Patent [19]

Fisch

[11] Patent Number: 4,705,739

[45] Date of Patent: * Nov. 10, 1987

[54] GRAPHIC ARTS IMAGING CONSTRUCTIONS USING VAPOR-DEPOSITED COLORANT AND METALLOID LAYERS WITH OVERLYING PHOTOSENSITIVE RESIST LAYER

[75] Inventor: Richard S. Fisch, St. Paul, Minn.

[73] Assignee: Minnesota Mining and Manufacturing Company, St. Paul, Minn.

[*] Notice: The portion of the term of this patent subsequent to Jul. 8, 2003 has been disclaimed.

[21] Appl. No.: 856,046

[22] Filed: Apr. 24, 1986

Related U.S. Application Data

[63] Continuation-in-part of Ser. No. 631,532, Jul. 16, 1984, abandoned.

[51] Int. Cl.$^4$ .......................... G03C 1/74; G03C 1/94
[52] U.S. Cl. ........................................ 430/276; 430/5; 430/158; 430/161; 430/166; 430/167; 430/271; 430/275; 430/277; 430/278; 430/279; 430/292; 430/294; 430/299; 427/70; 427/179; 427/248.1; 427/255.1; 427/255.2; 427/255.3
[58] Field of Search ............... 430/271, 275, 276, 277, 430/273, 279, 158, 166, 161, 167.5, 292, 294, 299; 427/70, 248.1, 255.1, 255.2, 255.3, 179

[56] References Cited

U.S. PATENT DOCUMENTS

| | | | |
|---|---|---|---|
| 3,811,884 | 5/1974 | Inoue et al. | 430/332 |
| 4,268,541 | 5/1981 | Ikeda et al. | 430/179 |
| 4,311,784 | 1/1982 | Fan | 430/271 |
| 4,405,678 | 9/1983 | Downing et al. | 427/179 |
| 4,455,364 | 6/1984 | Sasa | 430/299 |
| 4,599,298 | 7/1986 | Fisch | 430/964 |

Primary Examiner—Charles L. Bowers, Jr.
Attorney, Agent, or Firm—Donald M. Sell; James A. Smith; Lorraine R. Sherman

[57] ABSTRACT

A radiation-sensitive, imageable article comprises in sequence a substrate, a vapor-deposited colorant layer capable of providing a reflection optical density of at least 0.6 to a 10 nm band of the electromagnetic spectrum between 280 and 900 nm, a vapor-deposited metal or metalloid layer of uniform composition, and a photosensitive resist layer which is non-integral with said colorant layer, the ratio of the thickness of said colorant layer to said metal or metalloid layer being at least 7:1.

15 Claims, No Drawings

GRAPHIC ARTS IMAGING CONSTRUCTIONS USING VAPOR-DEPOSITED COLORANT AND METALLOID LAYERS WITH OVERLYING PHOTOSENSITIVE RESIST LAYER

CROSS-REFERENCE TO RELATED APPLICATION

This is a continuation-in-part of application Ser. No. 631,532, filed July 16, 1984, now abandoned the disclosure of which is incorporated herein by reference.

FIELD OF THE INVENTION

This invention relates to a radiation-sensitive article comprising in sequence a substrate, a vapor-deposited colorant layer, a vapor-coated metal or metalloid layer, and a layer of photoresist which may have additional layers such as protective inert or photosensitive organic layers. The article is useful in the graphic arts.

BACKGROUND ART

Colorants such as dyes and pigments are used in a wide variety of imaging procedures to provide optical densities for viewable images. Such widely diverse technologies as color photography, diazonium salt coupling lithographic and relief printing, dye bleach imaging, leuco dye oxidation sublimation transfer of dyes and photosensitive imaging systems all may use dyes and pigments to form the viewable optical densities. Examples of some of these types of technologies may be found for example in U.S. Pat. Nos. 3,136,637, 3,671,236, 4,307,182, 4,262,087, 4,230,789, 4,212,936, 4,336,323 and the like. In all of these systems the colorant is present in the imageable article within a carrier medium such as a solvent or polymeric binder. Each of these various imaging technologies has its various benefits and handicaps as measured by their respective complexity.

U.S. Pat. No. 4,271,256 discloses the use of dyes under a vapor-coated metal layer to enhance radiation absorption, but does not use a photoresist layer with the article.

U.S. Pat. No. 4,455,364 discloses a process for forming a metallic image in which a composite material comprises a ratio of a metal chelating agent to metal layer in the range of 0.01/1 to 5/1.

SUMMARY OF THE INVENTION

Briefly, the present invention provides a radiation-sensitive, imageable article having at least one vapor-deposited colorant layer on the surface of a substrate and a vapor-deposited metal or metalloid layer of uniform composition coated directly over the vapor-deposited colorant layer. Coated over the metal or metalloid layer is a layer of photosensitive photoresist material. Additional vapor-deposited layers may be present on any layer surface. Such optional additional layers may consist of vapor-coated organic protective layers, protective or matte-containing overcoats for the photosensitive layers, or combinations thereof. The preferred metal layer is generally formed on top of the colorant layer by any of the various vapor-depositing techniques known in the art. Prior to subjecting the vapor-deposited colorant and/or metal layer to any physical treatments or stress likely to damage the continuity of the coatings (e.g. rolling, folding, bending, and the like) an organic protective layer may be vapor-deposited onto the surface of the colorant and/or metal.

The present invention provides an article which is a multilayered material comprising in sequence a substrate, a 100 percent solids colorant layer (containing no binders or solvents), a vapor-deposited metal or metalloid layer of uniform composition, and a photoresist layer, the article also comprising optional vapor-deposited polymeric layers and photoresist layer capable of being imaged by electromagnetic radiation. The application of the vapor-deposited colorant layer under the metal layer provides additional useful density over and above the density provided by the metal layer alone as well as providing an opaque layer to mask any defects in the metal layer. The overcoated metal layer provides protection to the colorant layer and limits the abrasion of that layer. The colorant layer can easily be removed by mechanical (e.g., buffing) or solvent means. All radiation absorbing dyes and pigments are useful in the article of the present invention.

The combination of the vapor-deposited colorant layer on a substrate having a vapor-deposited metal layer (including layers comprising metal and metal compounds or metal and metal oxides in a dispersion) coated thereon provides uniquely desirable features. The metal provides high optical densitites and the colorant layer masks existing and later-formed defects without any adverse effect on image quality. The vapor-deposited metal layer which overcoats the dye layer may include metal/metal oxide or metal/metal sulfide disperions of uniform composition as disclosed in U.S. Pat. No. 4,268,541. Protective polymeric vapor-coated layers such as are disclosed in U.S. Pat. Nos. 4,268,541, and 4,363,844 may be employed between the vapor-coated colorant layer and the metal/metalloid layer, on top of the metal/metalloid layer, as well as an optional protective coating on top of the photoresist layer. The use of such layers on top of the metal layer is a preferred construction in this invention.

In the present invention, a photoresist layer is used above the metal or metalloid layer. The location of the colorant layer below the metal layer prevents any intermixing of the colorant and photoresist layer. It is of critical important in the present invention that penetration of dyes or pigments from the colorant layer into the photosensitive layer be avoided. The penetration of dyes or pigments into the photosensitive layer generates a disuniformity of speed in the vertical dimension of the photographic film which adversely affects the photoinitiated change in solubility that is essential to imaging. Such variations promote undercutting or incomplete image cleanout in negative and positive modes, respectively.

As used in the present invention: "flexible substrate" means a base sufficiently pliable so that it can be bent through an angle of at least 90 degrees without cracking or breaking;

"non-integral" means that a photoresist layer when deposited over the colorant layer which is further coated by a metal or metalloid layer and optionally a barrier layer of an organic material soluble in photoresist developer (i.e., aqueous alkaline solution at pH 13+, preferably as disclosed in U.S. Pat. No. 4,314,022) does not pick up or absorb more than ten percent by weight of the colorant. Preferably less than five percent and more preferably less than two percent by weight of colorant would be picked up or absorbed by the coated photoresist layer;

"radiation-sensitive" means sensitive to any form of electromagnetic radiation including heat and electron beam;

"uniform composition" means substantially consistent in composition throughout the layer, i.e., has less than 10%, preferably less than 5%, variation in the ratio of components throughout the layer; and "colorant layer/metal layer" means the ratio of thicknesses of the colorant layer/metal layer and includes the ratio of thicknesses of colorant layer/metalloid layer and colorant layer/combination of metal and metalloid layer.

Assignees, copending patent application, now U.S. Pat. No. 4,587,198, discloses a dye transfer imaging process which can utilize the article of the present invention. Assignee's copending patent application, U.S. Ser. No. 631,531, filed July 16, 1984 discloses a graphic arts imaging construction utilizing a graded metal/metal oxide or metal sulfide layer over a colorant layer.

DETAILED DESCRIPTION

The present invention provides a radiation-sensitive article comprising in sequence:

a substrate, a vapor-deposited colorant layer capable of providing a reflection optical density of at least 0.6, preferably at least 2.0, to a 10 nm band of the electromagnetic spectrum between 280 and 900 nm, at least one vapor deposited metal, combination of metals, or metalloid layer of uniform composition, and a radiation-sensitive resist layer.

The article of the present invention may optionally further comprise a protective organic layer on any or all of the metal layer, the colorant layer, and the photosensitive resist layer. The protective organic layer may comprise a material having phenoxy groups, alcohol groups, urea groups, ester groups, saccharide, or carbonyl groups (which may be part of carboxyl groups). A photoresist layer non-integral with the colorant layer can be coated over the protective layer which can overlie the metal layer. It is preferred that there be no substantial amount of radiation-absorbing material between the vapor-deposited colorant layer and the photoresist layer.

The application of a vapor-deposited colorant (dye or pigment) layer to the surface of a substrate, as noted above, provides certain advantages. The metal provides high optical densities and the colorant layer masks existing and later-formed defects in the metal or metalloid layer without any adverse effect on image quality. Further, the dye being present under the metal or metalloid layer shields it from dissolving in the solvent of the photoresist layer. The substrate may be adjacent the vapor-deposited colorant layer or it may be adjacent an optional primer layer having a vapor-deposited colorant layer thereon. The vapor-deposited colorant layer contains no binders or solvents and may itself be overcoated by an abrasion resistant, vapor-deposited organic layer.

The vapor-deposited colorant (dye or pigment) layer is coated in sufficient thickness so as to provide a transmission optical density of at least 0.3 (or 0.6 reflection optical density) to a 10 nm band of the electromagnetic spectrum between 280 and 900 nm (preferably between 400 and 700 nm), preferably a reflection optical density of at least 0.8 and most preferably a reflection optical density of at least 2.0 is provided by the colorant. Any dye or pigment from any chemical class which can be vapor-deposited can be used in the practice of the present invention. This includes, but is not limited to, methines, anthraquinones, oxazines, azines, thiazines, cyanines, merocyanines, phthalocyanines, indamines, triarylmethanes, benzylidenes, azos, monoazones, xanthenes, indigoids, oxonols, phenols, naphthols, pyrazolones, etc. The thickness of the layer depends upon the ability of the colorant to provide at least the minimum optical density. The vapor-deposited layer may be as thin as a few nanometers (e.g., three or ten nanometers) and may be as thick as a thousand nanometers. A general range would be three (3) to one thousand (1000) nanometers (30 to 10,000 A) and a preferred range would be ten (10) to seven hundred (700) nanometers (100 to 7000 A). A more preferred range would be ten (10) to four hundred (400) nanometers (100 to 4000 A) thickness for the dye or pigment. A plurality of dye layers or a mixture of dyes may be used in a single layer. More importantly, the dye preferably should provide a transmission optical density of 0.3 (reflection/optical density of at least 0.6). Ranges of reflection optical density from 0.5 to 5.0 and higher are obtainable. Preferably, reflection optical densities in the range of 0.6 to 5.0 should be provided. A range of 1.0 to 4.0 for the maximum reflection optical density at the wavelength of maximum absorbance of the dye is a useful goal, readily obtainable in the practice of the present invention.

The vapor-deposited metal layer may be any vapor-deposited metal or metalloid layer or layers and is of uniform composition. According to the practice of the present invention, the term metal layer is defined as a layer comprising metal, metal alloys, metal salts, and metal compounds. The corresponding meaning applies to the term metalloid layer. The term metal in metal layer is defined in the present invention to include semimetals (i.e., metalloids) and semiconductor materials. Metals include materials such as aluminum, antimony, beryllium, bismuth, cadmium, chromium, cobalt, copper, gallium, germanium, gold, indium, iron, lead, magnesium, manganese, molybdenum, nickel, palladium, rhodium selenium, silicon, silver, strontium, tellurium, tin, titanium, tungsten, vanadium, and zinc. Preferably the metal is selected from aluminum, chromium, nickel, tin, titanium and zinc. More preferably the metal is aluminum. Metal alloys such as aluminum-iron, aluminum-silver, bismuth-tin, and iron-cobalt alloys are included in the term metal layer and are particularly useful. Metal salts such as metal halides, metal carbonates, metal nitrates and the like are useful. Metal compounds such as metal oxides and metal sulfides are of particular utility in imaging systems. Metal layers comprising uniform mixtures of these materials such as maxtures of metal-metal oxides, metal-metal salts, and metal salts-metal oxides are also of particular interest. U.S. Pat. No. 4,268,844 teaches a method by which such coatings could be provided.

A particularly desirable vapor-deposited layer comprises a microstructured radiation-absorbing surface. These structures are generally known in the art as for example in U.S. Pat. Nos. 3,975,197, 4,138,262, and 4,252,843. In these patents the surface structure of the substrate is modified so as to absorb incident radiation. U.S. Pat. No. 4,396,643, discloses a microstructured surface having protuberances with average heights from peak to base of 20 to 1200 nanometers which provides very good radiation absorption.

The combined thickness of the vapor-deposited colorant layer/metal layer depends upon the particular needs of the final thickness and should be at least about 1000 A, preferably at least 2000 A. Generally, the layer would be no thicker than 100,000 A which would require a long etching period. A more practical commercial range would be between 2000 A and 8000 A.

It is preferred that the majority of the cross-section of the metal layer consists essentially of metal, metal alloys, metal salts and metal compounds.

Traces of up to 10 weight % or more of other materials may be tolerated generally in the layer. But metal layers with the majority (at least 50 weight %) of its cross-section consisting essentially of metals, metal alloys, metal salts, metal compounds and combinations thereof are preferred. The metal layer should have fewer than 100, preferably fewer than 50, and more preferably fewer than 30 defects per 177 mm$^2$.

Vapor-deposition of the colorant or metal layers may be accomplished by any means. Thermal evaporation of the metal or colorant, ion plating, radio frequency sputtering, A.C. sputtering, D.C. sputtering and other known processes for deposition may be used in the practice of the present invention. The pressure may vary greatly during coating, but is usually in the range of $10^{-6}$ to $10^{-4}$ torr.

Vapor-deposited layers of metals on substrates suffer from a number of serious limitations in their use as imaging materials, as in photoresist imaging articles. The metal layers tend to be difficult to vapor-deposit without defects (which reduces their ability to faithfully record images) and they re readily subject to the generation of additional defects during handling, transportation and use. In order to avoid such defects, a protective resin layer is generally vapor-deposited on the metal layer.

In graphic arts applications, particularly where the dye image is to be transferred to another substrate, the ratio of the thickness of the colorant layer/metal layer in the present invention is at least 7:1 which provides a reflection optical density of at least 0.8. At lower ratios enough colorant may not be present after transfer to insure this reflection optical density. Very high ratios, i.e., over 100:1, may result in a non-cohesive dye layer. Preferable colorant/metal layer ratios are in the range of 7:1 to 100:1, more preferably 10:1 to 50:1, and most preferably 10:1 to 30:1.

In the present invention, the organic protective layer may comprise a material with a vapor pressure at 20° C. no greater than that of 1-n-octanol selected from the group consisting of (1) organic materials having carbonyl groups (which may be but are not required to be part of carboxyl groups), (2) phenoxy groups (3) alcohols or (4) saccharides. The term "organic material" is used because the protective coating does not have to be a single compound or a monomeric compound. In addition to those types of materials, dimers, trimers, oligomers, polymers, copolymers, terpolymers and the like may be used.

The organic materials containing carbonyl groups which are not part of a carboxyl group, for example, include (1) amides, such as phthalamide, salicylamide, urea formaldehyde resins, and methylene-bis-acrylamide, and (2) anilides, such as phthalanilide and salicylanilide. It has been found that these organic materials may be used in layers as thin as 1 nm and provide good abrasion or mar protection. They may be used in thicknesses of up to 600 nm, but without dramatic improvement of results, and in fact often with some diminution of properties. A preferred range would be between 3 and 200 nm, more preferably between 5 and 100 nm, and most preferably at least 5 and lower than 30 or 20 nm.

The organic material containing carbonyl groups include ester group-containing materials such as polyester oligomers, low molecular weight polyester polymers (e.g., poly(ethyleneterephthalate), poly(ethyleneisophthalate), etc. having molecular weights between 5,000 and 50,000), diallyl phthalate (and its polymers), diallyl isophthalate (and its polymers), monomethyl phthalate, carboxylic acid alkyl esters, and the like.

The organic material containing phenoxy groups include such materials as Bisphenol A, and low molecular weight phenol formaldehyde resins (e.g., Resinox TM, Monsanto Chemical Co.). The alcohol containing materials would include 1-n-octanol, dodecanol. Benzyl alcohol and the like.

Preferably, the organic material is vapor-depositable as this is the general method preferred for application of the protective layer. The organic material may, for example, be deposited in the apparatus and procedures disclosed in the U.S. Pat. No. 4,268,541. The partition or baffle described in that apparatus (e.g., Example 1) has not been found to be essential. The two vapor streams (i.e., metal and organic material streams) maybe physically spaced apart or directed so that the coating zones for the two materials do not completely overlap.

The photosensitive layer may be either a negative-acting or positive-acting photoresist as known in the art. Positive-acting photoresist systems ordinarily comprise polymeric binders containing positive-acting diazonium salts or resins such as those disclosed, for example, in U.S. Pat. Nos. 3,046,120, 3,469,902 and 3,210,239. The positive-acting photosensitizers are commercially available and are well reported in the literature. Negative-acting photosensitive resist systems ordinarily comprise a polymerizable composition which polymerizes in a imagewise fashion when irradated, such as by exposure to light. These compositions are well reported in the literature and are widely commercially available. These compositions ordinarily comprise ethylenically- or polyethylenically-unsaturated photopolymerizable materials, although photosensitive epoxy systems are also known in the art. Preferably ethylenically-unsaturated photoplymerizable systems are used, such as acrylate, methacrylate, acrylamide and allyl systems. Acrylic and methacrylic polymerizable systems are not preferred according to the practice of the present invention. U.S. Pat. Nos. 3,639,185, 4,247,616, 4,008,084, 4,138,262, 4,139,391, 4,158,079, 3,469,982, U.K. Pat. No. 1,468,746, disclose photosensitive compositions generally useful in the practice of the present invention.

Non-polymerizable binders, dyes, pigments, antioxidants, filler, surfactants, acutance agents, antistatic agents, lubricants, and other well known adjuvants may be present within the photoresist layer. Useful binders, for examples, include acrylic resins (e.g., poly(alkyl methacrylate), poly(ethylacrylate), copolymers and the like) polymeric polyols (e.g., polyvinyl alcohol, and hydroxy substituted addition polyesters such as polyacrylate and polymethylacrylte polyesters), hydroxy substituted copolymers (such as poly [methyl methacrylate/hydroxy emthylacrylate]), natural colloids (for example, gelatin and shellac), polyvinyl hydrogenphthalate, ethylene oxide polymers and copolymers, polyacrylamides, polyethylinically unsaturated materials (such as polystyrene and its copolymers), polyamides, polyesters, and the other various polymeric materials both natural and synthetic, thermoplastic and crosslinked as known in the art. These materials preferably have at least some reasonable solubility in aqueous alkaline or organic developer solutions. The thickness of the photosensitive layer may generally be between 1.0 and 50 micrometers preferably between 2.5 and 15 micrometers, most preferably at least 2.5 and less than 10 micrometers. U.S Pat. No. 4,314,022 discloses single solution etchant baths particularly useful in the practice of the present invention. A two-solution etchant bath can also be useful. The first solution can contain material to remove the soluble photoresist portion of the photosensitive layer (e.g., water or aqueous hydroxide solution) and a second solution (e.g., $FeCl_3$) that can attack by oxidation or other means the now unprotected portion of the metal layer that was imagewise exposed by the first solution is then used.

The substrate may be any surface or material onto which colorant may be vapor-deposited. The substrate may be rough or smooth, transparent or opaque, flexible or rigid, and continuous or porous. It may be of natural or synthetic polymeric resin (thermoplastic or thermoset), ceramic, glass, metal, paper, fabric, and the like. For most commercial purposes the substrate is preferably a polymeric resin such as polyester [e.g., poly(ethyleneterephthalate)], cellulose ester, polycarbonate, polyvinyl resin [e.g., poly(vinylchloride), poly(vinylidene chloride), poly(vinylbutyral), poly(vinylformal)], polyamide, polyimide, polyacrylate (e.g., copolymers and homopolymers of acrylic acid, methacrylic acid, n-butyl acrylate, acrylic anhydride and the like), polyolefin, and the like. The polymer may be transparent, translucent or opaque. It may contain fillers such as carbon black, titania, zinc oxide, dyes, pigments, and of course, those materials generally used in the formation of films such as coating aids, lubricants, antioxidants, ultraviolet radiation absorbers, surfactants, catalysts, and the like.

In the present invention a color image is provided by exposing the photoresist layer on the imageable article to an imagewise distribution of radiation which alters the solubility and/or permeability of the photosensitive resist layer, and allowing an etching solution to permeate and/or remove the resist layer and attack (i.e., oxidize) the metal layer and which reveals a colored image through a dark (metal) background. An after-wash procedure is desirable to neutralize the etchant solution.

Objects and advantages of this invention are further illustrated by the following examples, but the particular materials and amounts thereof recited in these examples, as well as other conditions and details, should not be construed to unduly limit this invention.

EXAMPLE 1

A pigment designated as phthalocyanine blue

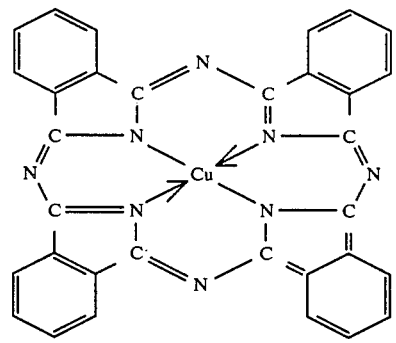

was placed into a metal molybdenum boat in a vacuum chamber and a 102 micrometer (4 mil) thick polyester film positioned 20.3 cm (8 inches) from the pigment source. At a pressure of $10^{-4}$ torr, heat was applied to the pigment source for a time necessary to produce a transmission optical density of 2.0 for the pigment on the web. An additional layer containing aluminum of 350 A in thickness was vapor-despoisted on top of the dye layer. The combined transmission optical density of these samples equaled 4.0. The colorant layer/metal layer ratio was calculated to be 34:1.

This construction was then coated with a photosensitive flexible novolak resin layer comprising:

|  | (grams) |
|---|---|
| methyl ethyl ketone | 32.0 |
| Resinox TM 7280 (phenol/formaldehyde (novolak) resin available from Monsanto) | 3.8 |
| cashew nut shell liquid | 1.3 |
| DDI TM -1410 (tradename for an aliphatic diisocyanate from General Mills Chemicals, Inc.) | 0.60 |
| Diazo oxide | 1.45 |
| Calco TM Yellow (American Cyanamide Co.) | 0.006 |
| Oil Soluble Blue G TM (Tradename - Capital Color Chemical Co.) | 0.02 |
| stannous octoate | 0.10 |
| tetra n-butyl phosphonium acetate | 0.53 |

The combined imaging film was then exposed for a period of 4 seconds to a halftone image using a Scott Micrographic printer and then hand developed using 1.0% sodium hydroxide solution at 38° C. for 2 min. and agitating with a printing plate pad. A positive replica of the halftone image on a blue background was obtained.

EXAMPLE 2

The colorant/metal layer construction of EXAMPLE 1 was repeated except at a yellow azo dye of the structure

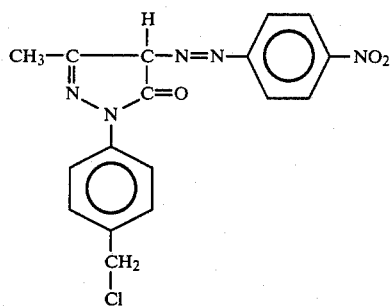

was substituted for the phthalocyanine pigment of that example. This colorant/metal layer construction was silk screen printed with a line copy screen using 3M UV curing ink (3M PCM-11 TM UV ink). After UV cure and using an Ashbee TM -200 watt/inch exposure device (Ashbel Co.) the construction was developed (the metal layer removed) using a 0.5 weight percent solution of ferric chloride. A yellow colored line copy was observed.

EXAMPLE 3

Using the technique described in EXAMPLE 1 a 9.1 kg (20 lb.) carbon coated paper made by Fitchburg Paper, Fitchburg, NY was vapor-coated with Hostapum Yellow G, CI 11680 (a yellow pigment*) to a reflection density of 3.0. This construction was in turn vapor-coated with an aluminum layer (700A). The colorant layer/metal layer ratio was calculated to be 20:1. A solvent coating of the photoresist layer described in U.S. Pat. No. 4,193,699 was applied to this package.

This light sensitive material was matted to a halftone dot target and vacuum printed in a Berkey 5KW light stand 5KW for 10 seconds.

After exposure the imaged film was developed in the developer solution described in U.S. Pat. No. 4,314,022, EXAMPLE 3, which is incorporated herein by reference, for 2 min. at 32° C.

A yellow color halftone image was seen against a shiny aluminum background.

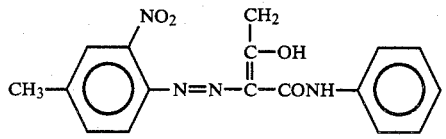

EXAMPLE 4—Ratio of dye layer to metal layer

Colorant layer/metal layer constructions using the method of Example 3 were prepared except that the dyes and dye/metal ratios (8 trials) were as shown in Table I below. The metal layer in each sample was 700 A in thickness.

TABLE I

| Dye | Ratio of dye layer/metal layer | Optical density |
|---|---|---|
| Rhodaming B (Matheson Coleman) | 8.5/1 | 1.0 |
| Rhodaming B (Matheson Coleman) | 7.7/1 | 0.90 |
| Eastman Blue GBN (Eastman Kodak, Rochester, NY)* | 4/1 | 0.33 |
| Eastman Blue GBN (Eastman Kodak, Rochester, NY) | 7/1 | 1.07 |
| EK dye** (Eastman Kodak) | 30/1 | 3.0+ |
| EK dye** (Eastman Kodak) | 18.5/1 | 2.2 |
| Yellow (azo dye of Ex. 3) | 9.4/1 | 0.49 |
| Yellow (azo dye of Ex. 3) | 20/1 | 2.33 |

*comparative example
**dye formula

[anthraquinone dye structure with four 2,6-diethylphenyl azo substituents]

The data of Table I show that the ratio of dye layer/metal layer can vary widely. The more preferred range was 7:1 to 30:1 to assure enough colorant after transfer (a 0.4, preferably 0.7, reflection optical density after transfer is desirable).

Various modifications and alterations of this invention will become apparent to those skilled in the art without departing from the scope and spirit of this invention, and it should be understood that this invention is not to be unduly limited to the illustrative embodiments set forth herein.

I claim:

1. A radiation-sensitive, imageable article comprising in sequence:
    a substrate
    a vapor-deposited colorant layer consisting of a colorant providing a reflection optical density of at least 0.6 to a 10 nm band of the electromagnetic spectrum between 280 and 900 nm,
    at least one vapor-deposited metal, combination of metals, or metalloid layer of uniform composition coated directly over said colorant layer, and
    a photosensitive resist layer which is non-integral with said colorant layer, the ratio of the thickness of said colorant layer/said metal or metalloid layer being at least 7:1, and the layers being located so as to prevent any intermixing of said colorant and photoresist layers, and said article being capable of providing a colored image through a metallic background.

2. The article according to claim 1 wherein said colorant provides a reflection optical density in the range of 0.5 to 5.0.

3. The article according to claim 1 wherein said colorant provides a reflection optical density in the range of 0.6 to 5.0.

4. The article according to claim 1 wherein said colorant layer has a thickness in the range of 30 to 10,000 A.

5. The article according to claim 1 wherein said substrate comprises a natural or synthetic polymeric resin.

6. The article according to claim 1 wherein said ratio of thicknesses of said colorant layer/metal layer is in the range of 7:1 to 100:1.

7. The article according to claim 1 further comprising fan organic abrasion-protective layer directly over said metal layer.

8. The article according to claim 1 wherein said vapor-deposited colorant layer is selected from at least one dye or pigment.

9. The article according to claim 1 wherein said photosensitive resist layer comprises an ethylenically- or polyethylenically-unsaturated photopolymerizable material or a photosensitive epoxy system.

10. The article according to claim 1 wherein said photosensitive resist layer is positive- or negative-acting.

11. The article according to claim 1 wherein said article is a color proofing film.

12. The article according to claim 1 wherein said article is a colored overhead projection film.

13. The article according to claim 1 wherein said ratio of thicknesses of said colorant layer/metal layer is in the range of 10:1 to 50:1.

14. The article according to claim 1 further comprising an organic protective layer directly over said photosensitive resist layer.

15. A radiation-sensitive, imageable article comprising in sequence:
a substrate,
a vapor-deposited colorant layer consisting of a colorant capable of providing a reflection optical density of at least 0.6 to a 10 nm band of the electromagnetic spectrum between 280 and 900 nm,
an organic protective layer, at least one vapor-deposited metal, combination
of metals, or metalloid layer of uniform composition, and
a photosensitive resist layer which is non-integral with said colorant layer, the ratio of the thickness of said colorant layer/metal layer being at least 7:1, and the layers being located so as to prevent any intermixing of said colorant and photoresist layers, and said article being capable of providing a colored image through a metallic background.

* * * * *